(12) United States Patent
Terashi

(10) Patent No.: US 6,753,277 B2
(45) Date of Patent: Jun. 22, 2004

(54) CERAMICS HAVING EXCELLENT HIGH-FREQUENCY CHARACTERISTICS AND METHOD OF PRODUCING THE SAME

(75) Inventor: Yoshitake Terashi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 376 days.

(21) Appl. No.: 09/795,909

(22) Filed: Feb. 27, 2001

(65) Prior Publication Data

US 2001/0029228 A1 Oct. 11, 2001

(30) Foreign Application Priority Data

Feb. 29, 2000 (JP) .......................... 2000/054009
Mar. 21, 2000 (JP) .......................... 2000/078012

(51) Int. Cl.[7] .................. C03C 14/00; C04B 35/04; C04B 35/14; C04B 35/18; C04B 35/185
(52) U.S. Cl. .................. 501/32; 501/120; 501/125; 501/128; 501/136; 501/153; 501/154; 428/209; 174/258
(58) Field of Search .................. 501/32, 120, 125, 501/128, 153, 154, 209, 258, 136, 5

(56) References Cited

U.S. PATENT DOCUMENTS

| 4,861,646 A | * | 8/1989 | Barringer et al. ............ 428/210 |
| 5,756,408 A | * | 5/1998 | Terashi et al. .................. 501/8 |
| 5,763,059 A | * | 6/1998 | Yamaguchi et al. ........ 428/209 |
| 6,121,173 A | * | 9/2000 | Terashi .......................... 501/4 |
| 6,232,251 B1 | * | 5/2001 | Terashi et al. .................. 501/5 |

FOREIGN PATENT DOCUMENTS

| JP | 11-049531 A | * | 2/1999 |
| JP | 2000-016837 A | * | 1/2000 |
| JP | 2000-128628 A | * | 5/2000 |

* cited by examiner

*Primary Examiner*—David R Sample
(74) *Attorney, Agent, or Firm*—Hogan & Hartson

(57) ABSTRACT

Ceramics comprising filler crystal particles having an average particle diameter of not smaller than 2.5 μm and a matrix crystal phase present on the grain boundaries of the filler crystal particles, the filler crystal particles being $Al_2O_3$ and the matrix crystal phase being diopside-type oxide crystals precipitated from the crystallized glass. The ceramics has a dielectric loss tangent at 60 to 77 GHz of not higher than $50 \times 10^{-4}$, and can be effectively used as an insulating substrate in a wiring board for transmitting high-frequency signals.

11 Claims, 2 Drawing Sheets

CERAMICS HAVING EXCELLENT HIGH-FREQUENCY CHARACTERISTICS AND METHOD OF PRODUCING THE SAME

BACKGROUND OF THE INVENTION

1. Field of the Invention

The present invention relates to ceramics having excellent high-frequency characteristics and is useful for forming a wiring board used in various devices such as packages for containing semiconductor elements, and to a method of producing the same. The invention further relates to a starting composition used for the production of the above ceramics and to a wiring board produced from the above ceramics.

2. Description of the Prior Art

The most widely used wiring board employed for the packages for containing semiconductor elements can be represented by the one in which a wiring layer of a high-melting metal such as tungsten or molybdenum is formed on the surface or inside an insulating substrate that is formed of an aluminaceous sintered product.

At the present time of a highly sophisticated information technology, the frequency band for transmitting signals is shifting toward an ever high frequency region. In a high-frequency wiring board for handling high-frequency signals, the electric conductor forming the wiring layer must have a small resistance and the insulating substrate must have a small dielectric loss tangent at the high-frequency regions, in order to transmit high-frequency signals without loss.

However, a high-melting metal such as tungsten (W) or molybdenum (Mo) has a large resistance and, hence, the wiring board provided with a wiring layer of such a high-melting metal propagates signals at a slow speed and, further, makes it difficult to propagate signals of a high-frequency region of not lower than 1 GHz. It, therefore, becomes necessary to form a wiring layer by using a low-resistance metal such as copper, silver or gold instead of using tungsten or molybdenum.

Due to their low melting points, however, the low-resistance metals cannot be co-fired with alumina which is a material forming the insulating substrate. That is, the insulating substrate and the wiring layer cannot be formed at one time by the co-firing. Therefore, there has been developed a wiring board that can be used as an insulating substrate comprising a so-called glass ceramics (a composite material of glass and ceramics) that can be co-fired with a low-resistance metal.

For example, Japanese Unexamined Patent Publication (Kokai) No. 212363/1990 (prior art A) proposes ceramics obtained by molding and firing a mixture of an AlN powder having an average secondary particle diameter (central particle diameter) of from 3.1 to 8.9 $\mu$m and a borosilicate glass powder having an average secondary particle diameter (central particle diameter) of from 1.5 to 16 $\mu$m. According to this prior art A, the average secondary particle diameter of the AlN powder and the average secondary particle diameter of the glass powder are controlled to lie within predetermined ranges, in order to enhance the density of the molded article and to improve thermal conductivity of the ceramics.

Further, Japanese Unexamined Patent Publication (Kokai) No. 349166/1992 (prior art B) proposes ceramics obtained by molding a mixture of an $Al_2O_3$ powder having an average secondary particle diameter of 1 to 7 $\mu$m, an $SiO_2$ powder (10 to 20% by weight) and a PbO powder (20 to 30% by weight) followed by firing at 960° C. for 15 minutes. The prior art B teaches the ceramics having a high thermal conductivity and a large strength by using an $Al_2O_3$ powder having an average secondary particle diameter of 2.5 to 6 $\mu$m.

The ceramics disclosed in the prior arts A and B have advantages of being obtained by the co-firing with a low-resistance metal such as copper, silver or gold, but also have the problems as described below.

That is, in the prior art A, the AlN powder reacts with the glass powder due to firing, whereby fine pores are formed in the ceramics resulting in an increase in the dielectric loss tangent (tan $\delta$). Further, AlN has such a property that its tan $\delta$ varies depending upon the frequency and exhibits a large tan $\delta$ depending upon the frequency band.

The ceramics of the prior art B is excellent in regard to its thermal conductivity and mechanical strength, but exhibits a large tan $\delta$ at a high-frequency band due to its large Pb content.

As described above, the ceramics disclosed in the prior arts A and B exhibit large tan $\delta$ at high-frequency regions and are not suited for use as the insulating substrate for the wiring board used in, for example, the GHz band due to their large tan $\delta$ for high-frequency signals.

SUMMARY OF THE INVENTION

It is therefore an object of the present invention to provide ceramics that can be obtained by firing in a temperature region (800 to 1050° C.) in which a low-resistance conductor such as gold, silver or copper can be co-fired together therewith, and which exhibits a low dielectric loss tangent at a high-frequency region, and a method of producing the same.

Another object of the invention is to provide a composition useful as a starting material for producing the above ceramics.

A further object of the invention is to provide a wiring board having an insulating substrate formed of the above ceramics, and exhibiting excellent high-frequency transmission characteristics.

According to the present invention, there is provided a starting composition for the production of ceramics, comprising;

(a) a crystallized glass containing $SiO_2$, $Al_2O_3$ and MO (M: an alkaline earth metal element) and having a Pb content in an amount of 0 or not larger than 10% by weight in terms of PbO; and (b) at least one kind of filler having an average primary particle diameter of not smaller than 3 $\mu$m and selected from the group consisting of $Al_2O_3$, $SiO_2$, $MgTiO_3$, $(Mg, Zn)TiO_3$, $TiO_2$, $SrTiO_3$, $MgAl_2O_4$, $ZnAl_2O_4$, cordierite, mullite, enstatite, willemite, $CaAl_2Si_2O_8$, $SrAl_2Si_2O_8$, $(Sr, Ca)Al_2Si_2O_8$ and forsterite;

the cyrstallized glass (a) and the filler (b) being contained at a weight ratio a/b of from 30/70 to 99/1.

According to the present invention, further, there is provided ceramics comprising filler crystal particles and a matrix crystal phase formed by a set of a number of crystal particles present on the grain boundaries of the filler crystal particles;

the filler crystal particles comprising at least one kind of oxide crystals selected from the group consisting of $Al_2O_3$, $SiO_2$, $MgTiO_3$, $(Mg, Zn)TiO_3$, $TiO_2$, $SrTiO_3$, $MgAl_2O_4$, $ZnAl_2O_4$, cordierite, mullite, enstatite, willemite, $CaAl_2Si_2O_8$, $SrAl_2Si_2O_8$, $(Sr, Ca)Al_2Si_2O_8$ and forsterite;

the ceramics exhibiting a dielectric loss at 60 to 77 GHz of not higher than $50\times10^{-4}$.

According to the present invention, further, there is provided a method of producing ceramics, comprising:

a step of preparing the staring composition for the production of ceramics;

a step of molding the starting composition for the production of ceramics into a predetermined shape; and a step of firing the obtained molded article at 800 to 1050° C. for not less than 30 minutes.

According to the present invention, there is further provided a wiring board comprising an insulating substrate and a metallized wiring layer arranged on the surface and/or inside the insulating substrate, the insulating substrate being formed of the above ceramics.

If briefly described, a distinct feature of the present invention resides in the use, in combination, of (a) a crystallized glass containing $SiO_2$, $Al_2O_3$ and an alkaline earth metal oxide (MO) and having a Pb content which is suppressed to be not larger than a predetermined value (not larger than 10% by weight in terms of PbO), and (b) a filler having an average primary particle diameter of not smaller than 3 μm and selected from particular inorganic oxide crystals. That is, the starting composition for the production of ceramics containing (a) the crystallized glass and (b) the filler, makes it possible to obtain the ceramics by firing at 800 to 1050° C. When the ceramics is used as an insulating substrate of the wiring board, therefore, the wiring board can be produced at one time by the co-firing with a low-resistance conductor such as gold, silver or copper. Further, the ceramics has a crystal matrix with a small Pb content precipitated from the crystallized glass on the grain boundaries of the filler crystal particles having an average particle diameter of not smaller than 2.5 μm. Due to this structure, the ceramics exhibits a small dielectric loss tangent (tan δ) at a high-frequency band, i.e., exhibits a dielectric loss tangent (tan δ) at, for example, 60 to 77 GHz of not higher than $50\times10^{-4}$. Therefore, the above ceramics is very useful as a material for constituting the insulating substrate of the wiring board used for the transmission of high-frequency signals.

DETAILED DESCRIPTION OF THE INVENTION

Figure 1:
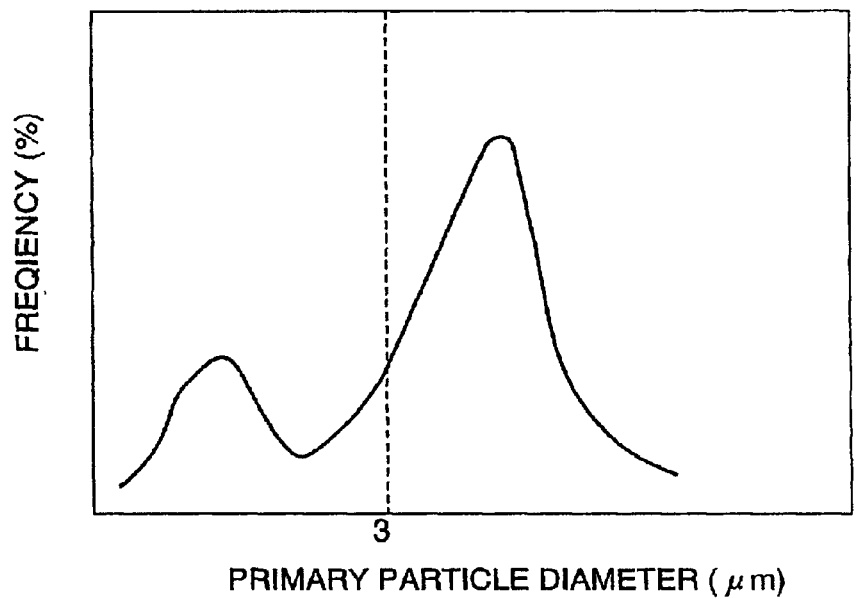
FIG. 1 shows a curve representing a distribution of the primary particle diameters of a filler used in the present invention.

Starting Composition for Producing Ceramics
Crystallized Glass (a).

The crystallized glass used in the present invention contains $Al_2O_3$, $SiO_2$ and MO (M: alkaline earth element) as an essential component. The crystalline glass containing these components has a low dielectric loss tangent (tan δ). By using this crystallized glass, it is allowed to obtain ceramics having a low tan δ and a large strength. The alkaline earth element M is selected from the group consisting of Mg, Ca, Sr and Ba, and is contained in one, two or more kinds as oxides in the crystallized glass.

It is desired that the $Al_2O_3$ content in the crystallized glass is from 2.5 to 40% by weight, the $SiO_2$ content is from 35 to 60% by weight, and the total amount of the alkaline earth element oxide (MO) is from 5 to 55% by weight.

In the present invention, it is also important that the Pb content in the crystallized glass is not larger than 10% by weight, particularly, not larger than 5% by weight, and more particularly, not larger than 1% by weight in terms of PbO. The glass containing Pb in large amounts has a low softening point and is advantageous in regard to enhancing the density at low temperatures, and causes the ceramics to exhibit an increased tan δ at a high-frequency band. As the softening point of the glass is lowered, further, it becomes difficult to remove the binder in the step of producing the ceramics; i.e., the obtained ceramics includes large amounts of pores and residual carbon, causing discoloration, drop of insulation, increased tan δ and decreased strength. In particular, when the glass is co-fired together with a copper metallize, the above defect appears more conspicuously since the binder is not efficiently removed. In order to suppress copper from being oxidized, the firing must be conducted in a nonoxidizing atmosphere which, however, makes it more difficult to remove the binder.

As described above, therefore, the present invention uses a crystallized glass having a Pb content which is not larger than a predetermined amount. It is desired that the crystallized glass has a softening point which is higher than that of, for example, a so-called Pb glass and, particularly, in a range of from 700 to 850° C. and, most preferably, in a range of from 800 to 830° C.

The crystallized glass used in the present invention may contain, for example, ZnO, TiO and $B_2O_3$ in a total amount of not larger than 20% by weight in addition to containing the above-mentioned essential components. From the standpoint of decreasing the tan δ, however, it is desired that the $B_2O_3$ content is not larger than 7% by weight and, particularly, not larger than 3% by weight. The components such as alkali metal elements (Li, Na, K, etc.), $ZrO_2$, $Mn_2O_3$, $Cr_2O_3$ and NiO increase the dielectric loss. It is therefore desired that their total amount is not larger than 3% by weight (in terms of oxides).

The crystallized glass having the above-mentioned various components are capable of precipitating various kinds of crystals depending upon their compositions through firing that will be described later. It is, however, desired that the crystallized glass has such a composition that the degree of crystallization after firing is not smaller than 90% and, particularly, not smaller than 95%. When the degree of crystallization is small, the obtained ceramics contains large amounts of an amorphous glass phase having a high tan δ, which may make it difficult to decrease the tan δ of the ceramics. The degree of crystallization is found by X-ray diffraction analyzing the glass that is heat-treated under the same conditions as the firing conditions, and calculating a ratio of amorphous glass phases relying on the Liedbert's method.

As the crystals precipitated from the crystallized glass, there can be exemplified $SiO_2$ crystals, spinel-type oxide crystals such as $MgAl_2O_4$, diopside-type oxide crystals such as $CaMgSi_2O_6$, as well as cordierite, mullite, enstatite, willemite, $CaMgSi_2O_7$ (akermanite), $CaMgSiO_4$ (monticellite), $Ca_3MgSi_2O_8$ (merwinite), $MgSiO_3$, $3Al_2O_3 \cdot 2SiO_2$, $Mg_2Al_4Si5O_{18}$, $SrAl_2Si_2O_8$, (Sr, Ca)Al$_2$Si$_2$O$_8$ (slausonite), CaAl$_2$Si$_2$O$_8$ (anorthite), BaAl$_2$Si$_2$O$_8$ (celsian), (Ca, Sr)SiO$_3$, SrSiO$_3$ and forsterite. In addition to these crystals, there may be further precipitated gahnite, TiO$_2$, (Zn, Mg)TiO$_3$, (Zn, Mg)$_2$TiO$_4$ and nZnO.B$_2$O$_3$ as sub-crystal phases.

From the standpoint of decreasing the dielectric loss tangent (tan δ) of the ceramics and increasing the strength of the ceramics, it is advantageous to use a crystallized glass that precipitates diopside-type oxide crystals, MgAl$_2$O$_4$, ZnAl$_2$O$_4$, cordierite, mullite, enstatite, willemite, CaAl$_2$Si$_2$O$_8$, SrAl$_2$Si$_2$O$_8$, (Sr, Ca)Al$_2$Si$_2$O$_8$, forsterite and, particularly, diopside-type oxide crystals. In order to increase the coefficient of thermal expansion of the ceramics, further, it is advantgeous to use a crystallized glass that precipitates SiO$_2$, MgAl$_2$O$_4$, ZnAl$_2$O$_4$, diopside-type oxide crystals, enstatite or forsterite.

Ideally, the diopside-type oxide crystal has a composition expressed by CaMg(SiO$_3$)$_2$ and in which Al and Sr may exist as solid solutions and, for example Mg or Si may be partly substituted by Al, and Si may be partly substituted by Sr. The diopside-type oxide crystal has a high coefficient of thermal expansion of about 8 to about 9 ppm/° C. and has a Young's modulus of as high as about 150 GPa. By using a crystallized glass that precipitates the diopside-type oxide crystals, therefore, it is allowed to increase the coefficient of thermal expansion of the ceramics to be not smaller than 5 ppm/° C. and to increase the strength of the ceramics to be not smaller than 200 MPa and, particularly, not smaller than 250 MPa.

The crystallized glass capable of precipitating the diopside-type oxide crystals contains, for example, 30 to 55% by weight of SiO$_2$, 4.5 to 15% by weight of Al$_2$O$_3$, 16 to 35% by weight of MgO and 24 to 40% by weight of CaO. From the standpoint of increasing the amount of precipitation of the diopside-type oxide crystals, however, it is desired that the crystallized glass contains CaO and MgO in a total amount of from 35 to 50% by weight. In order to enhance the sintering property at low temperatures, further, it is desired that SrO is contained. In this case, the crystallized glass desirably contains 30 to 55% by weight of SiO$_2$, 4 to 15% by weight of Al$_2$O$_3$, 14 to 30% by weight of MgO, 5 to 20% by weight of CaO and 10 to 25% by weight of SrO.

The dielectric loss increases when the ceramics contains large amounts the amorphous glass phase that has high tan δ. It is therefore desired that the degree of crystallization of the glass in the ceramics after firing is not lower than 90% and, particularly, not lower than 95%. The degree of crystalization of the glass is found by calculating the ratio of the amorphous glass phases relying on the Liedbert's method by using X-ray diffraction peaks of the glass after the heat treatment.

It is desired that the crystallized glass is used in the form of a powder having an average secondary particle diameter in a range of from 0.5 to 4 μm and, particularly, from 1 to 2.5 μm as measured by, for example, the sedimentation method.

Filler (b):

In the present invention, there is used, as a filler, at least one kind of an oxide crystal powder selected from the group consisting of alumina (Al$_2$O$_3$), SiO$_2$, MgTiO$_3$, (Mg, Zn)TiO$_3$, TiO$_2$, SrTiO$_3$, MgAl$_2$O$_4$, ZnAl$_2$O$_4$, cordierite, mullite, enstatite, willemite, CaAl$_2$Si$_2$O$_8$, SrAl$_2$Si$_2$O$_8$, (Sr, Ca)Al$_2$Si$_2$O$_8$ and forsterite. By using the above filler in combination with the above-mentioned crystallized glass (a), it becomes possible to obtain ceramics having low tan δ at the high-frequency regions and a high strength.

In the present invention, it is advantageous to use alumina (Al$_2$O$_3$), MgAl$_2$O$_4$, ZrAl$_2$O$_4$, enstatite, diopside, CaAl$_2$Si$_2$O$_8$, SrAl$_2$Si$_2$O$_8$, or (Sr, Ca)Al$_2$Si$_2$O$_8$ as the filler from the standpoint of decreasing the dielectric loss tangent and increasing the strength. Further, it is most desired to use Al$_2$O$_3$ as the filler from the standpoint of obtaining ceramics having a favorable thermally conducting property. Examples of the alumina include α-Al$_2$O$_3$ (corundum), β-Al$_2$O$_3$ and γ-Al$_2$O$_3$. Among them, γ-Al$_2$O$_3$ is desired from the standpoint of promoting the crystallization of the glass. In particular, when the γ-Al$_2$O$_3$ is used in combination with the above-mentioned crystallized glass (a) capable of precipitating the diopside-type oxide crystal phase, it is allowed to obtain highly strong ceramics having tan δ at 60 to 77 GHz of not higher than 30×10$^{-4}$, particularly, not higher than 15×10$^{-4}$ and, more particularly, not higher than 10×10$^{-4}$, having a dielectric constant of not higher than 10 and, particularly, not higher than 8, having a thermal conductivity of not smaller than 3W/m·K, and having a strength of not lower than 250 MPa and, particularly, not lawer than 300 MPa. Upon the firing, the γ-Al$_2$O$_3$ may partly undergo the phase modification into α-Al$_2$O$_3$. In order to increase the strength of the ceramics, it is desired to add the α-Al$_2$O$_3$ as another filler.

The filler exists in the form of a powder of a spherical shape, needle-like shape, plate shape or indefinite shape. The present invention, however, uses the filler having an average primary particle diameter of not smaller than 3 μm, desirably, not smaller than 5 μm, more desirably, not smaller than 5.5 μm and, most desirably, not smaller than 10 μm as measured by a known image analysis method such as an intercepting method by using a scanning electron microphotography (SEM). By using the filler powder having such a large average primary particle diameter, it is allowed to increase the amount of the filler without spoiling the sintering property under the firing temperature conditions that will be described later. As a result, the oxide crystals exhibit properties to a sufficient degree, and the ceramics exhibits very decreased dielectric loss, increased strength and increased thermally conducting property. (But, when γ-Al$_2$O$_3$ is used as alumina, the primary average diameter of the γ-Al$_2$O$_3$ may be smaller than 3 μm. The reason is that the γ-Al$_2$O$_3$ promotes greatly the crystallization of the glass.)

The filler powder used in the present invention has a large average primary particle diameter as described above and, hence, exhibits an average secondary particle diameter of not smaller than 5 μm as measured by the sedimentation method. Here, it is desired that the difference between the average secondary particle diameter and the average primary particle diameter is not larger than 30% and, particularly, not larger than 15%, per the average primary particle diameter. That is, upon using the powder that difficultly coagulates as a filler, the filler oxide crystal particles disperse uniformly making it possible to obtain dense ceramics having less pores and a high relative density. The filler powder which difficultly coagulates can be obtained by, for example, a spray thermal cracking method or a hydrothermal synthetic method.

In order to enhance the density of the ceramics and to increase the strength of the ceramics according to the present invention, it is also allowable to use the filler powder having a large average primary particle diameter in combination with a fine powdery filler having an average primary particle diameter which is about one-fifth thereof. In this case, too, the filler as a whole must have a primary particle diameter of not smaller than 3 μm from the standpoint of decreasing the dielectric loss. It is further desired that the distribution of the primary particle diameters of the filler contains two peaks as shown in FIG. 1.

Preparation of a Starting Composition for Producing Ceramics

The starting composition for producing the ceramics of the present invention is obtained by mixing the above-mentioned crystallized glass (a) and the filler (b) at a weight ratio a/b of from 30/70 to 99/1, preferably, from 40/60 to 99/1, particularly preferably, from 45/55 to 80/20 and, most desirably, from 50/50 to 65/45. In particular, it is desired to use the above-mentioned crystallized glass capable of precipitating the diopside-type oxide crystals and the $Al_2O_3$ at a ratio of from 40/60 to 99/1.

When the amount of the crystallized glass (a) is smaller than the above range or when the amount of the filler (b) is larger than the above range, it becomes difficult to obtain dense ceramics by firing at a temperature of not higher than 1050° C. that will be described later. When the amount of the crystallized glass (a) is larger than the above range or when the amount of the filler (b) is smaller than the above range, the amount of the amorphous glass increases in the ceramics which, then, exhibits increased tan δ.

In the present invention, it is allowable to add a glass or a filler other than the component (a) or the component (b) in small amounts (e.g., in an amount of not larger than 30% by weight per the total amount of the components (a) and (b)) so far as the object of the present invention (decreasing tan δ of the ceramics in the high-frequency region) is not impaired.

The crystallized glass (a) and the filler (b) can be mixed in a dry form. To maintain the above-mentioned primary particle diameter of the filler, however, it is desired to mix the two in a wet form in the presence of a suitable amount of solvent. In this case, as required, there may be further added an organic binder, a plasticizer and a dispersant.

The thus prepared starting composition for producing the ceramics is very effective in producing the ceramics having low dielectric loss tangent (tan δ) at high-frequency regions.

Preparation of Ceramics

In the present invention, the above-mentioned starting composition for producing the ceramics is molded in a predetermined shape and is fired to obtain ceramics having low tan δ at high-frequency regions.

As required, an organic binder, a plasticizer and a dispersant are added to the above starting composition which is then molded by known means such as doctor blade method, calender roll method, rolling method or press-molding method.

The binder is removed prior to firing the molded article. To effectively remove the binder, the crystallized glass (a) containing Pb in a small amount is used. Desirably, the crystallized glass (a) has a softening point that lies within the above range.

The firing is conducted in an oxidizing atmosphere of a nitrogen-oxygen mixed gas or in an inert atmosphere such as of a nitrogen gas at 800 to 1050° C. for not less than 30 minutes. When the firing temperature is not higher than 800° C., it becomes difficult to sinter the particles and, hence, difficult to obtain the ceramics which is sufficiently dense having less pores. Besides, the amount of the amorphous glass phase increases in the ceramics, and tan δ increases at the high-frequency regions. When the firing is conducted at a temperature in excess of 1050° C. by using the ceramics as an insulating substrate for the wiring board, it becomes difficult to conduct the co-firing with a low-resistance metal containing Cu or Ag as a chief component.

In order that the ceramics has a high relative density and becomes dense to a sufficient degree through firing at the above-mentioned temperature range, it is desired to adjust the rate of increasing the temperature at the time of firing and the rate of decreasing the temperature after the firing. Besides, in order for the ceramics to contain the amorphous glass in an amount of not larger than 30% by weight and, particularly, not larger than 10% by weight, it is desired that the rate of increasing the temperature and the rate of decreasing the temperature are not larger than 1000° C./hour in a temperature region of not lower than 750° C.

Ceramics

The thus obtained ceramics of the present invention is so dense as to exhibit a relative density of not smaller than 95%, particularly, not smaller than 97% and, more particularly, not lower than 99%, and contains pores in very small amounts.

Figure 2:
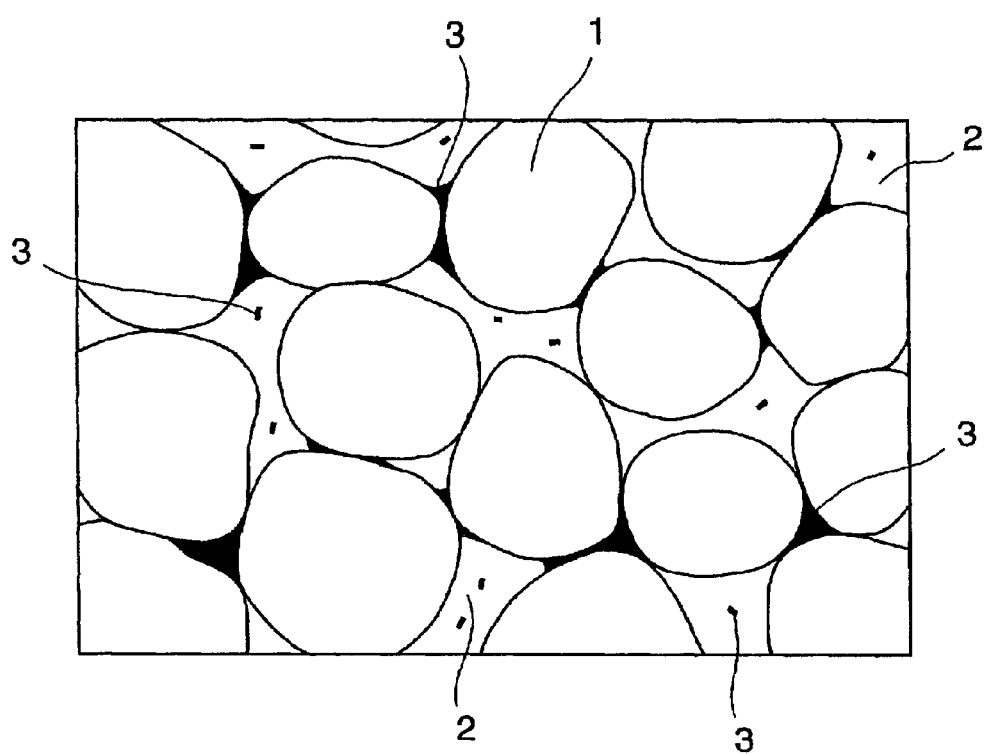
FIG. 2 is a diagram schematically illustrating the texture of the ceramics of the present invention.

Being prepared by using the starting composition containing the crystallized glass (a) and the filler (b), further, the ceramics of the present invention has a dispersed structure as shown in FIG. 2. That is, the ceramics has filler oxide crystal particles (hereinafter referred to as filler particles) 1 that stem from the filler (b), and a matrix crystal phase 2 precipitated from the crystallized glass (a) exists on the grain boundaries of the filler particles 1. Further, an amorphous glass phase 3 stemming from the crystallized glass (a) remains on the grain boundaries of the filler particles 1.

In the above-mentioned dispersed structure, the average particle diameter of the filler particles 1 tend to become smaller than the average primary particle diameter of the filler (b) that is used as a starting material, and is, usually, not smaller than 2.5 µm, desirably, not smaller than 3.5 µm, particularly, not smaller than 4.5 µm and, most desirably, not smaller than 8 µm. As described above, the ceramics of the present invention has a very high relative density and is dense to a sufficient degree and, hence, has a dispersed structure in which the filler particles 1 having the above diameter are uniformly distributed.

The matrix crystal phase 2 is formed by a set of a number of crystal particles (usually, not larger than 1 µm and, particularly, not larger than 0.8 µm) precipitated from the crystallized glass (a), and is formed depending upon the kind of the crystallized glass that is used, e.g., formed of diopside-type oxide crystal particles.

The amorphous glass phase 3 is a residue of the crystallized glass (a) and contains Si in an amount of not smaller than 40% by weight and, particularly, not smaller than 70% by weight in terms of an oxide ($SiO_2$) depending upon the kind of the crystallized glass (a) that is used. The amorphous glass phase 3 partly exists even inside the matrix crystal phase 2. From the standpoint of decreasing the dielectric loss tangent, it is desired that the content of the amorphous glass phase 3 in the ceramics is suppressed to be not larger than a predetermined amount, such as not larger than 30% by weight and, particularly, not larger than 10% by weight. The content of the amorphous glass phase 3 is adjusted by controlling the composition of the crystallized glass (a) or by controlling the above-mentioned firing conditions (rate of raising/lowering the temperature).

The ceramics of the present invention has various compositions depending upon the kinds of the crystallized glass (a) and the filler (b) that are used. Described below are examples of the ceramic compositions produced by using a crystallized glass capable of precipitating diopside-type oxide crystals and $Al_2O_3$.

① When the SrO component is not contained, and when the total amount of the metal elements of Si, Al, Mg and Ca is 100% by weight in terms of oxides thereof.

$SiO_2$: 15 to 47.6% by weight
$Al_2O_3$: 32.4 to 65% by weight
MgO: 8 to 35% by weight
CaO: 12 to 40% by weight ② When the SrO component is contained, and when the total amount of the metal elements of Si, Al, Mg, Ca and Sr is 100% by weight in terms of oxides thereof.

$SiO_2$: 15 to 49.6% by weight
$Al_2O_3$: 32.4 to 65% by weight
MgO: 8 to 35% by weight
CaO: 2.5 to 20% by weight
SrO: 7.5 to 25% by weight The ceramics of the present invention produced from the starting composition comprising the above-mentioned crystallized glass (a) and the filler (b), and having the dispersed structure as shown in FIG. 2, exhibits tan δ at 60 to 77 GHz of not higher than $50 \times 10^{-4}$, and is suited for forming an insulating substrate in a wiring board for dealing with signals of a frequency of, for example, not lower than 1 GHz, particularly, not lower than 20 GHz, and, further, not lower than 50 GHz, and, particularly, not lower than 70 GHz.

Further, the ceramics can be adjusted to exhibit a coefficient of thermal expansion of not smaller than 5 ppm/° C., particularly, not smaller than 6 ppm/° C., more particularly, not smaller than 8 ppm/° C. and, most particularly, not smaller than 10 ppm/° C. over a temperature range of from room temperature up to 400° C., so that the coefficient of thermal expansion of the wiring board is brought close to the coefficient of thermal expansion of a chip or a printed board that is to be mounted. When there is a large difference in the coefficient of thermal expansion between the insulating substrate in the wiring board and the chip or the printed board, stress occurs in the mounting portion between the two due to a difference in the coefficient of thermal expansion as they are heated at the time of mounting by soldering or due to the repetition of a temperature cycle caused by the start and stop of operation of the semiconductor element. Therefore, cracks develop in the mounting portion and the mounting structure loses reliability. The ceramics of the present invention makes it possible to adjust the coefficient of thermal expansion over the above-mentioned range and, hence, to effectively avoid a drop in the reliability of the mounting structure that stems from a difference in the coefficient of thermal expansion. For example, the difference in the coefficient of thermal expansion from that of a GaAs chip or an organic resin (e.g., epoxy resin) constituting a printed board can be decreased to be 2 ppm/° C. or smaller.

The ceramics of the present invention has a strength of not smaller than 200 MPa, particularly, not smaller than 250 MPa and, more particularly, not smaller than 300 MPa. Therefore, the wiring board is not broken when an electronic part such as semiconductor element is mounted on a wiring board or when the lead wires are connected to the input/output terminals of the wiring board.

Further, the ceramics of the invention has a thermal conductivity of as high as not smaller than 2 W/m·K, particularly, not smaller than 3 W/m·K and, more particularly, not smaller than 4 W/m·K, and efficiently radiates heat generated by the wiring board or from the electronic part such as semiconductor element mounted thereon to prevent the electronic part from malfunctioning due to a rise in the temperature.

Wiring Board

Figure 3:
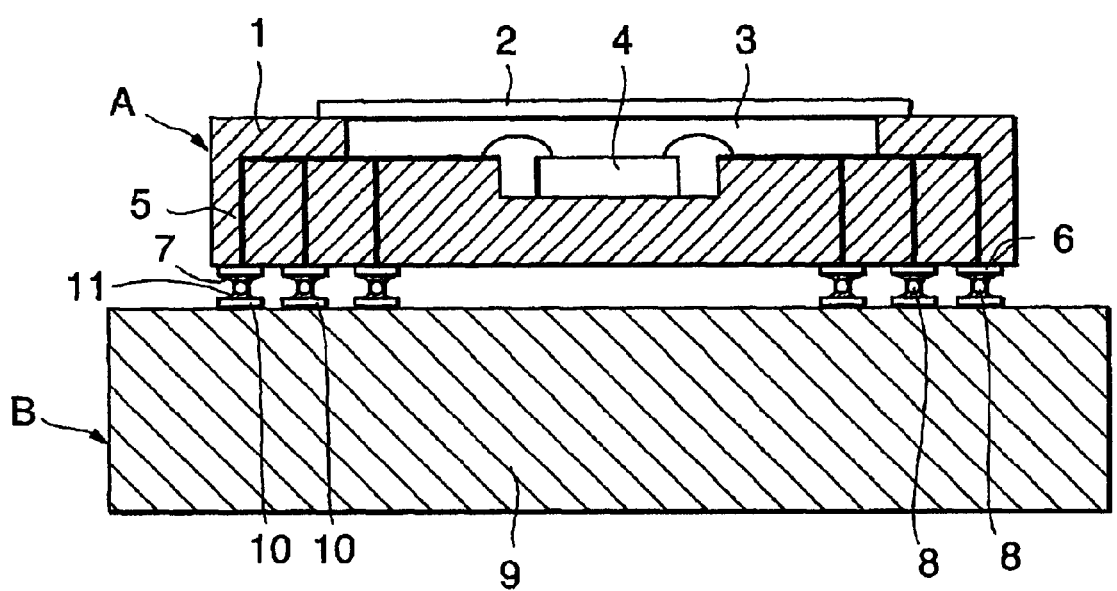
FIG. 3 is a sectional view schematically illustrating a structure for mounting a package for containing a semiconductor element, which is a wiring board equipped with an insulating substrate comprising the ceramics of the present invention.

FIG. 3 illustrates a wiring board equipped with an insulating substrate formed of the ceramics of the present invention.

In FIG. 3, a package for containing a semiconductor device generally designated at A is a ball grid array (BGA) type package having connection terminals which are ball-like terminals, and being provided with an insulating substrate 1 formed of the ceramics of the present invention. A cavity 3 is formed by an electromagnetic-shielding closure member 2 provided on the insulating substrate 1. Further, a chip 4 of GaAs or the like is mounted on the insulating board 1 in the cavity 3 by using a known adhesive such as resin, Ag-epoxy, Ag-glass, Au-Si or the like.

The insulating substrate 1 is usually formed by laminating plural insulating layers of the ceramics of the present invention one upon the other. The insulating layer, however, may be a single layer. The closure member 2, too, is mounted by using the adhesive same as the above one.

A wiring layer 5 is formed on the surface and inside of the insulating substrate 1, and is electrically connected to the chip 4 through wire bondings or TAB tapes. The wiring layer 5 is formed of a low-resistance metal such as copper, silver or gold in order to minimize the conduction loss in transmitting high-frequency signals. When the signals of a frequency of not lower than 1 GHz are to be transmitted, in particular, it is desired to constitute the wiring layer 5 by using a known strip line, a microstrip line, a coplanar line or a dielectric waveguide line to transmit high-frequency signals without loss.

In the package A of FIG. 3, electrode layers 6 for connection are deposited on the bottom surface of the insulating substrate 1 and are connected to the wiring layer 5 in the package A. Ball-like terminals 8 are adhered to the electrode layers 6 for connection via a brazing material 7 such as solder.

As shown in FIG. 3, this package A is mounted on an external circuit board B. The external circuit board B has an insulating substrate 9 formed of an organic resin such as polyimide resin, epoxy resin or phenol resin, and wiring conductors 10 are formed on the surface of the insulating substrate 9. Ball-like terminals 8 attached to the bottom surface of the insulating substrate 1 of the package A are brought into contact with the wiring conductors 10 on the external circuit board B, and are brazed to the wiring conductors 10 by using a solder 11 such as Pb—Sn, so that the package A is mounted on the external circuit board B. The package A can also be mounted by connecting the ball-like terminals 8 to the wiring conductors 10 by melting.

The wiring layer 5 is formed of a low-resistance conductor and the insulating substrate 1 is formed of the ceramics of the present invention that exhibits low tan δ at the high-frequency regions. Therefore, the package A effectively decreases the transmission loss in transmitting high-frequency signals and is capable of dealing with signals of frequencies of not lower than 1 GHz as described already. Further, the package has a very small difference in the coefficient of thermal expansion (e.g., 2 ppm/° C. or smaller) from the GaAs chip 4 and the insulating substrate 9 of the external circuit board B. As a result, the mounting structure between the package A and the external circuit B shown in FIG. 3 effectively suppresses the thermal stress that occurs when subjected to the heat cycle, and offers a very high degree of reliability for extended periods of time.

The above package A can be easily produced by the co-firing with a low-resistance conductor such as cu, Ag or gold that forms the wiring layer 5 in compliance with the above-mentioned method of producing the ceramics, and is excellent even from the standpoint of productivity.

Concretely speaking, the package A is produced in a manner as described below.

That is, a starting composition is prepared by using a crystallized glass (a) that has been prepared in advance and a filler (b), and into which is mixed an organic solvent and an organic binder to prepare a slurry for molding. By using this slurry for molding, a ceramic green sheet is molded by known means that was described above.

As required, through holes are formed in the green sheet and are filled with a metal paste which contains at least one of copper, gold or silver as a chief component. The metal paste is applied onto the surface of the green sheet in a pattern of the wiring layer 5 by printing such as screen printing method or gravure printing method. In this case, it is desired that the wiring layer that is formed has a thickness of from 5 to 30 $\mu$m.

Next, a plural number of the above green sheets are laminated with their positions in match and are adhered together with pressure (when the insulating substrate 1 is of a single layer, one piece of green sheet may be used). Then, through the co-firing in a nonoxidizing atmosphere of nitrogen gas or nitrogen-oxygen mixed gas at a temperature of 800 to 1050° C. for more than 30 minutes, there is obtained an insulating substrate 1 or a wiring board equipped with the wiring layer 5. The chip 4 such as a semiconductor element is mounted on the wiring board, is connected to the wiring layer 5, the closure member 2 is mounted, and the ball-like terminals 8 are adhered to obtain the package A of the structure shown in FIG. 3.

The above package A may hold a chip of the silicon type or the GaAs type as a semiconductor element and may, particularly effectively, hold a chip of the GaAs type (having a coefficient of thermal expansion of 6 to 7.5 ppm/° C.) since the coefficient of thermal expansion is close thereto.

EXPERIMENTS

Experiment 1

Crystallized glasses (hereinafter simply referred to as glasses) A to E having the following compositions and an average secondary particle diameter of 2 $\mu$m were prepared.

Glass A: $SiO_2$ 50.2 wt %–$Al_2O_3$ 5.0 wt %–MgO 16.1 wt %–CaO 15.1 wt %–SrO 13.6 wt %

Glass B: $SiO_2$ 50 wt %–$Al_2O_3$ 5.5 wt %–MgO 18.5 wt %–CaO 26 wt %

Glass C: $SiO_2$ 44 wt %–$Al_2O_3$ 29 wt %–MgO 11 wt %–ZnO 7 wt %–$B_2O_3$ 9 wt %

Glass D: $SiO_2$ 12 wt %–$Al_2O_3$ 23.5 wt %–MgO 0.5 wt %–CaO 13 wt %–$B_2O_3$ 23 wt %–$Li_2O$ 12.5wt %–$Na_2O$ 15.5 wt %

Glass E: $SiO_2$ 18 wt %–$Al_2O_3$ 55 wt %–PbO 27 wt %

To the above glasses were added filler powders (purity of 99%) shown in Tables 1 to 4, as well as an organic binder, a plasticizer and toluene. The mixture was wet-mixed together for 20 hours to prepare a staring composition (slurry) for producing the ceramics. Tables 1 to 4 show average primary particle diameters (primary diameters) of the filler powders as found from the SEM photographs based on the intercept method and average secondary particle diameters (secondary diameters) based on the micro-tracking method.

By using the above slurry, a green sheet having a thickness of 300 $\mu$m was prepared by the doctor blade method.

The green sheets in a number of 10 to 15 were laminated one upon another and were heat-adhered together at a temperature of 50° C. while applying a pressure of 9.8 MPa. The obtained laminate was subjected to the binder-removing processing in a nitrogen atmosphere at 700° C., and was then fired in dry nitrogen at firing temperatures shown in Tables 1 to 4 for two hours to obtain ceramics (samples Nos. 1 to 55) for forming insulating substrates. In conducting the firing, the temperature was raised and lowered at a rate of 300° C./h.

The obtained ceramics were measured for their dielectric constants, dielectric loss tangent (tan $\delta$), coefficients of thermal expansion, identified for their crystal phases, measured for their thermal conductivities, contents of amorphous glass phase, Si contents in the amorphous glass phase and strengths. The results were as shown in Tables 1 to 4.

Measurement of Dielectric Constants and Dielectric Losses

The obtained ceramics were cut in a shape of a diameter of 2 to 7 mm and a thickness of 1.5 to 2.5 mm, and were measured for their dielectric constants and dielectric loss tangent (tan $\delta$) at 60 GHz by the dielectric rod resonator method by using a network analyzer and a synthesized sweeper. In taking the measurement, the dielectric resonator was excited by an NRD guide (nonradiating dielectric line), and the dielectric constants and the tan $\delta$ were calculated from the resonance characteristics in the $TE_{021}$ and $TE_{031}$ modes.

Measurement of Coefficients of Thermal Expansion

A curve of thermal expansion of the ceramics was plotted at room temperature to 400° C. to calculate the coefficients of thermal expansion.

Identification of Crystal Phases

The crystal phase in the sintered product was identified from a chart of X-ray diffractions.

Measurement of Thermal Conductivities

Samples having a thickness of 1 $\mu$m were measured for their thermal conductivities by the laser flashing method.

Content of Amorphous Glass Phase and Content of Si in the Amorohous Glass Phase The content of the amorphous glass phase in the ceramics was measured by the Liedbert's method. Concretely speaking, the ceramics to be evaluated was pulverized, ZnO was added as an internal standard sample at a predetermined ratio, followed by the addition of ethanol, and the mixture was wet-mixed together. The mixture was dried and was put to the X-ray diffraction measurement, and a ratio of the amorphous glass phase in the ceramics was calculated from the ratio of adding ZnO and from the ratio of ZnO obtained by the Liedbert' method and of the crystal phase in the ceramics. Further, the ratio of silicon in the amorphous glass phase was measured by TEM, and the content of silicon was calculated in terms of $SiO_2$.

Strength

Four-point flexural strengths of the ceramics were measured based upon JIS R1601.

TABLE 1

| Sample No. | Composition (% by wt) | | | | | Firing temp. (° C.) | Porosity (%) | Filler diameter (μm) | Dielectric constant |
|---|---|---|---|---|---|---|---|---|---|
| | Glass amount | Filler | Primary diameter | Secondary diameter | Amount | | | | |
| 1 | A 25 | α-Al$_2$O$_3$ | 5.0 | 7.5 | 75 | 1000 | 15 | 5.0 | 7.0 |
| 2 | A 40 | α-Al$_2$O$_3$ | 5.0 | 7.5 | 60 | 950 | 0.3 | 5.0 | 8.5 |
| 3 | A 50 | α-Al$_2$O$_3$ | 2.5 | 3.0 | 50 | 950 | 0.3 | 2.5 | 8.2 |
| 4 | A 60 | α-Al$_2$O$_3$ | 2.5 | 3.0 | 40 | 950 | 0.2 | 2.5 | 7.8 |
| 5 | A 70 | α-Al$_2$O$_3$ | 2.5 | 3.0 | 30 | 950 | 0.1 | 2.5 | 7.5 |
| 6 | A 85 | α-Al$_2$O$_3$ | 5.0 | 7.5 | 15 | 950 | 0.1 | 5.0 | 7.4 |
| 7 | A 100 | — | — | — | — | 850 | 0.1 | — | 7.4 |
| 8 | A 65 | α-Al$_2$O$_3$ | 0.6 | 2.0 | 35 | 950 | 0.3 | 0.6 | 8.7 |
| 9 | A 45 | α-Al$_2$O$_3$ | 2.0 | 20 | 55 | 950 | 10 | 2.0 | 9.0 |
| 10 | A 65 | α-Al$_2$O$_3$ | 5.0 | 20 | 35 | 950 | 0.2 | 5.0 | 7.9 |
| 11 | A 65 | α-Al$_2$O$_3$ | 8.5 | 12.0 | 35 | 950 | 0.2 | 8.5 | 7.8 |
| 12 | A 65 | α-Al$_2$O$_3$ | 10.0 | 13.0 | 35 | 950 | 0.2 | 10.0 | 7.8 |
| 13 | A 65 | α-Al$_2$O$_3$ | 5.0 | 5.0 | 35 | 950 | 0.2 | 5.0 | 7.8 |
| 14 | A 65 | α-Al$_2$O$_3$ | 5.0 | 10.0 | 35 | 950 | 0.1 | 5.0 | 7.8 |
| 15 | A 65 | α-Al$_2$O$_3$ | 10.0 | 10.0 | 35 | 950 | 0.2 | 10.0 | 7.9 |

| Sample No. | tan δ × 10$^{-4}$ | Coefficient of thermal expansion (ppm/° C.) | Precipitated crystal phase | Glass phase | | Thermal conductivity (W/m · K) | Ceramic strength (MPa) |
|---|---|---|---|---|---|---|---|
| | | | | content (% by wt) | SiO$_2$ (% by wt) | | |
| 1 | 60 | 7.7 | DI > S,F | 1 | 60 | 2.9 | 150 |
| 2 | 8 | 8.4 | DI > S,F | 1 | 60 | 5.5 | 300 |
| 3 | 10 | 8.6 | DI > S,F | 2 | 70 | 4.7 | 300 |
| 4 | 11 | 8.5 | DI > S,F | 3 | 72 | 4.2 | 320 |
| 5 | 13 | 8.4 | DI > S,F | 2 | 65 | 4 | 310 |
| 6 | 12 | 8.6 | DI > S,F | 3 | 60 | 3.2 | 310 |
| 7 | 60 | 9.1 | DI | 20 | 70 | 1.7 | 170 |
| 8 | 56 | 8.8 | DI | 20 | 76 | 2 | 180 |
| 9 | 70 | 8.6 | DI > S,F | 14 | 50 | 4.4 | 300 |
| 10 | 11 | 8.5 | DI > S,F | 2 | 50 | 5 | 330 |
| 11 | 9 | 8.7 | DI > S,F | 1 | 50 | 5.2 | 340 |
| 12 | 8 | 8.6 | DI > S,F | 1 | 45 | 5.3 | 350 |
| 13 | 12 | 8.5 | DI > S,F | 2 | 50 | 4.8 | 330 |
| 14 | 8 | 8.6 | DI > S,F | 1 | 45 | 5 | 350 |
| 15 | 7 | 8.5 | DI > S,F | 1 | 50 | 5.1 | 350 |

DI: diopside, Al: alumina, SP: spinel, S: slausonite, F: forsterite

TABLE 2

| Sample No. | Composition (% by wt) | | | | | Firing temp. (° C.) | Porosity (%) | Filler diameter (μm) | Dielectric constant |
|---|---|---|---|---|---|---|---|---|---|
| | Glass amount | Filler | Primary diameter | Secondary diameter | Amount | | | | |
| 16 | A 60 | SiO$_2$ | 5.0 | 7.5 | 40 | 950 | 0.1 | 5.0 | 5.8 |
| 17 | A 60 | SiO$_2$ | 7.5 | 10.0 | 40 | 950 | 0.1 | 7.5 | 5.7 |
| 18 | A 60 | MgTiO$_2$ | 5.0 | 10.0 | 40 | 950 | 0.1 | 5.0 | 12 |
| 19 | A 60 | (MgZn)TiO$_2$ | 5.0 | 10.0 | 40 | 950 | 0.2 | 5.0 | 11 |
| 20 | A 60 | TiO$_2$ | 5.0 | 10.0 | 40 | 950 | 0.1 | 5.0 | 15 |
| 21 | A 60 | SrTiO$_2$ | 5.0 | 10.0 | 40 | 950 | 0.1 | 5.0 | 25 |
| 22 | A 60 | MgAl$_2$O$_4$ | 5.0 | 10.0 | 40 | 950 | 0.3 | 5.0 | 7.0 |
| 23 | A 60 | ZnAl$_2$O$_4$ | 5.0 | 10.0 | 40 | 950 | 0.1 | 5.0 | 7.1 |
| 24 | A 60 | cordierite | 5.0 | 10.0 | 40 | 950 | 0.3 | 5.0 | 6.2 |
| 25 | A 60 | mullite | 5.0 | 10.0 | 40 | 950 | 0.1 | 5.0 | 6.5 |
| 26 | A 60 | enstatite | 5.0 | 10.0 | 40 | 950 | 0.2 | 5.0 | 6.4 |
| 27 | A 60 | willemite | 5.0 | 10.0 | 40 | 950 | 0.3 | 5.0 | 7.1 |
| 28 | A 60 | CaAl$_2$Si$_2$O$_8$ | 5.0 | 10.0 | 40 | 950 | 0.1 | 5.0 | 7.2 |
| 29 | A 60 | SrAl$_2$Si$_2$O$_8$ | 5.0 | 10.0 | 40 | 950 | 0.2 | 5.0 | 7.7 |
| 30 | A 60 | (Sr,Ca)Al$_2$Si$_2$O$_8$ | 5.0 | 10.0 | 40 | 950 | 0.1 | 5.0 | 7.8 |
| 31 | A 60 | forsterite | 5.0 | 10.0 | 40 | 950 | 0.2 | 5.0 | 6.6 |

| Sample No. | tan δ × 10$^{-4}$ | Coefficient of thermal expansion (ppm/° C.) | Precipitated crystal phase | Glass phase | | Thermal conductivity (W/m · K) | Ceramic strength (MPa) |
|---|---|---|---|---|---|---|---|
| | | | | content (% by wt) | SiO$_2$ (% by wt) | | |
| 16 | 18 | 11 | DI | 1 | 60 | 2 | 260 |
| 17 | 17 | 11.5 | DI | 1 | 65 | 2.1 | 270 |

TABLE 2-continued

| | | | | | | | |
|---|---|---|---|---|---|---|---|
| 18 | 15 | 10 | DI | 2 | 65 | 2.7 | 250 |
| 19 | 16 | 10.4 | DI | 2 | 70 | 2.5 | 260 |
| 20 | 27 | 8.9 | DI | 2 | 70 | 2.5 | 260 |
| 21 | 30 | 9.2 | DI | 2 | 65 | 2.6 | 250 |
| 22 | 9 | 9.0 | DI | 1 | 65 | 3.4 | 250 |
| 23 | 10 | 9.5 | DI | 1 | 65 | 3.5 | 300 |
| 24 | 7 | 5.9 | DI | 1 | 65 | 1.8 | 260 |
| 25 | 8 | 8.8 | DI | 1 | 65 | 2 | 260 |
| 26 | 8 | 9.5 | DI | 1 | 60 | 2 | 270 |
| 27 | 9 | 5.5 | DI | 2 | 60 | 1.7 | 260 |
| 28 | 33 | 5.9 | DI | 2 | 60 | 1.8 | 260 |
| 29 | 15 | 5.8 | DI | 2 | 60 | 1.8 | 260 |
| 30 | 13 | 5.7 | DI | 2 | 60 | 1.8 | 260 |
| 31 | 8 | 9 | DI | 1 | 70 | 2 | 260 |

DI: diopside, Al: alumina, SP: spinel,

TABLE 3

| Sample No. | Composition (% by wt) | | | | | Firing temp. (° C.) | Porosity (%) | Filler diameter (μm) | Dielectric constant |
|---|---|---|---|---|---|---|---|---|---|
| | Glass amount | Filler | Primary diameter | Secondary diameter | Amount | | | | |
| 32 | B 25 | $\alpha\text{-}Al_2O_3$ | 5.0 | 7.5 | 75 | 950 | 0.2 | 5.0 | 6.0 |
| 33 | B 50 | $\alpha\text{-}Al_2O_3$ | 5.0 | 7.5 | 50 | 1000 | 0.1 | 5.0 | 7.3 |
| 34 | B 55 | $\alpha\text{-}Al_2O_3$ | 5.0 | 7.5 | 40 | 950 | 0.2 | 5.0 | 7.4 |
| 35 | B 60 | $\alpha\text{-}Al_2O_3$ | 5.0 | 7.5 | 30 | 875 | 0.1 | 5.0 | 7.5 |
| 36 | B 65 | $\alpha\text{-}Al_2O_3$ | 5.0 | 5.0 | 35 | 850 | 0.3 | 5.0 | 7.7 |
| 37 | B 65 | $\alpha\text{-}Al_2O_3$ | 5.0 | 10.0 | 35 | 875 | 0.2 | 5.0 | 7.9 |
| 38 | B 65 | $\alpha\text{-}Al_2O_3$ | 0.6 | 10.0 | 35 | 875 | 0.2 | 0.6 | 7.8 |
| 39 | B 60 | $SiO_2$ | 5.0 | 7.5 | 40 | 850 | 0.1 | 5.0 | 5.8 |
| 40 | B 60 | $MgTiO_3$ | 5.0 | 10.0 | 40 | 850 | 0.1 | 5.0 | 13 |
| 41 | B 60 | $(MgZn)TiO_3$ | 5.0 | 10.0 | 40 | 850 | 0.2 | 5.0 | 12 |
| 42 | B 60 | $MgAl_2O_4$ | 5.0 | 10.0 | 40 | 875 | 0.2 | 5.0 | 6.9 |

| Sample No. | tan δ × 10$^{-4}$ | Coefficient of thermal expansion (ppm/° C.) | Precipitated crystal phase | Glass phase | | Thermal conductivity (W/m · K) | Ceramic strength (MPa) |
|---|---|---|---|---|---|---|---|
| | | | | content (% by wt) | $SiO_2$ (% by wt) | | |
| 32 | 77 | 6.5 | DI | 1 | 80 | 2.8 | 170 |
| 33 | 35 | 8.5 | DI | 2 | 80 | 5 | 300 |
| 34 | 17 | 8.5 | DI | 3 | 90 | 4.4 | 320 |
| 35 | 13 | 8.9 | DI | 2 | 83 | 3.6 | 350 |
| 36 | 10 | 9.5 | DI | 5 | 80 | 3.8 | 350 |
| 37 | 8 | 9.3 | DI | 3 | 80 | 4.2 | 350 |
| 38 | 60 | 7.2 | DI | 30 | 55 | 1.6 | 200 |
| 39 | 10 | 11 | DI | 1 | 60 | 2 | 255 |
| 40 | 13 | 9.9 | DI | 2 | 70 | 2.6 | 250 |
| 41 | 14 | 10.3 | DI | 2 | 80 | 2.6 | 255 |
| 42 | 8 | 9.0 | DI | 1 | 66 | 3.3 | 255 |

DI: diopside

TABLE 4

| Sample No. | Composition (% by wt) | | | | | Firing temp. (° C.) | Porosity (%) | Filler diameter (μm) | Dielectric constant |
|---|---|---|---|---|---|---|---|---|---|
| | Glass amount | Filler | Primary diameter | Secondary diameter | Amount | | | | |
| 43 | C 25 | $\alpha\text{-}Al_2O_3$ | 5.0 | 7.5 | 75 | 1000 | 15 | 5.0 | 5.0 |
| 44 | C 50 | $\alpha\text{-}Al_2O_3$ | 5.0 | 7.5 | 50 | 950 | 0.1 | 5.0 | 6.2 |
| 45 | C 60 | $\alpha\text{-}Al_2O_3$ | 5.0 | 7.5 | 40 | 875 | 0.1 | 5.0 | 5.9 |
| 46 | C 70 | $\alpha\text{-}Al_2O_3$ | 5.0 | 7.5 | 30 | 850 | 0.2 | 5.0 | 5.8 |
| 47 | C 65 | $\alpha\text{-}Al_2O_3$ | 0.6 | 10.0 | 35 | 950 | 10 | 0.6 | 5.3 |
| 48 | C 65 | $\alpha\text{-}Al_2O_3$ | 5.0 | 5.0 | 35 | 950 | 0.1 | 5.0 | 5.9 |
| 49 | C 65 | $\alpha\text{-}Al_2O_3$ | 5.0 | 10.0 | 35 | 950 | 0.3 | 5.0 | 6.0 |
| 50 | C 60 | $SiO_2$ | 5.0 | 7.5 | 40 | 850 | 0.1 | 5.0 | 5.4 |
| 51 | C 60 | $MgTiO_3$ | 5.0 | 10.0 | 40 | 950 | 0.3 | 5.0 | 11 |
| 52 | C 60 | $(MgZn)TiO_3$ | 5.0 | 10.0 | 40 | 850 | 0.1 | 5.0 | 10 |
| 53 | D 30 | $\alpha\text{-}Al_2O_3$ | 5.0 | 7.5 | 70 | 950 | 0.1 | 5.0 | 8.8 |

TABLE 4-continued

| 54 | D | 30 | SiO$_2$ | 5.0 | 7.5 | 70 | 850 | 0.3 | 5.0 | 4.8 |
| 55 | E | 50 | α-Al$_2$O$_3$ | 5.0 | 7.5 | 50 | 950 | 0.1 | 5.0 | — |

| Sample No. | tan δ × 10$^{-4}$ | Coefficient of thermal expansion (ppm/° C.) | Precipitated crystal phase | Glass phase content (% by wt) | SiO$_2$ (% by wt) | Thermal conductivity (W/m·K) | Ceramic strength (MPa) |
|---|---|---|---|---|---|---|---|
| 43 | 60  | 5   | SP | 20 | 45 | 1.2 | 180 |
| 44 | 13  | 5.8 | SP | 20 | 50 | 2.6 | 300 |
| 45 | 14  | 5.6 | SP | 24 | 50 | 2.4 | 295 |
| 46 | 14  | 5.5 | SP | 30 | 47 | 2.1 | 290 |
| 47 | 70  | 5.5 | SP | 27 | 50 | 1.3 | 170 |
| 48 | 16  | 5.6 | SP | 28 | 45 | 1.8 | 290 |
| 49 | 15  | 5.7 | SP | 25 | 50 | 2.2 | 300 |
| 50 | 14  | 8.9 | SP | 18 | 60 | 1.6 | 260 |
| 51 | 13  | 7.5 | SP | 16 | 50 | 1.7 | 270 |
| 52 | 12  | 7.6 | SP | 17 | 45 | 1.8 | 275 |
| 53 | 40  | 7.2 | As | 2  | 42 | 6   | 305 |
| 54 | 35  | 13  | As | 2  | 40 | 2.5 | 260 |
| 55 | >100| 7.7 | —  | 30 | 20 | 6.4 | 270 |

SP: spinel, As: anorthite

As will be obvious from the results of Tables 1 to 4, the sample No. 48 that uses the glass E containing not smaller than 10% by weight of Pb in terms of PbO exhibited an increased dielectric loss and could not be measured.

The samples Nos. 1, 24 and 35 using not more than 30% by weight of the glasses A, B and C containing not more than 10% by weight of PbO, could not be sintered at low temperatures and were not dense. The sample No. 7 using the glasses A, B and C in an amount of not smaller than 99% by weight and containing the filler in an amount of not more than 1% by weight, exhibited decreased crystallinity of the glass and an increased tan δ.

The samples Nos. 8, 9, 30 and 39 using powders having average particle diameters of not larger than 3 μm as fillers, exhibited increased tan δ.

On the other hand, the ceramics (samples Nos. 2 to 6, 10 to 23, 25 to 29, 31 to 34, 36 to 38, 40 to 53) that contained SiO$_2$, Al$_2$O$_3$ and MO (M=alkaline earth metal) obtained by using glasses A, B, C and D containing not more than 10% by weight of PbO and having an average particle diameter of not smaller than 3 μm, all exhibited excellent properties such as tan δ at 60 GHz of not higher than 50×10$^{-4}$, coefficients of thermal expansion of not smaller than 5 ppm/° C., ceramic strength of not smaller than 250 MPa and thermal conductivities of not smaller than 2 W/m·K.

Experiment 2

Glasses A to C having the following compositions and an average secondary particle diameter of 2 μm were prepared as the crystallized glasses.

Glass A: SiO$_2$ 50.2 wt %–Al$_2$O$_3$ 5.0 wt %–MgO 16.1 wt %–CaO 15.1 wt %–SrO 13.6 wt %

Glass B: SiO$_2$ 47.5 wt %–Al$_2$O$_3$ 4.8 wt %–MgO 16.8 wt %–CaO 14.2 wt %–SrO 16.7 wt %

Glass C: SiO$_2$ 10.4 wt %–Al$_2$O$_3$ 2.5 wt %–B$_2$O$_3$ 45.3 wt %–CaO 35.2 wt %–Na$_2$O 6.6 wt %

Among the above glasses, the glasses A and B could precipitate the diopside-type oxide crystals, and the glass C could not precipitate the diopside-type oxide crystal.

Filler powders (purity of 99%) shown in Tables 5 and 6 were added to the above glasses to prepare starting compositions (slurries) for preparing the ceramics in the same manner as in Experiment 1. As the filler powders shown in Tables 5 and 6, there was used γ-Al$_2$O$_3$ having an average primary particle diameter of 1 μm and as other filler powders, there was used γ-Al$_2$O$_3$ having an average particle diameter of 2 μm.

By using the above slurries, laminates of 10 to 15 ceramic green sheets were prepared in the same manner as in Experiment 1, subjected to the binder-removing processing in a nitrogen atmosphere containing water vapor at 700° C., and were fired in a dry nitrogen at firing temperatures shown in Tables 5 and 6 for two hours to obtain ceramics (samples Nos. 1 to 30) for obtaining insulating substrates.

The obtained ceramics were measured for a variety of items in the same manner as in Experiment 1. The results were as shown in Tables 5 and 6. The ceramics were further measured for their Young's moduli by an ultrasonic pulse method in compliance with JIS R1602-1995. The results were as shown in Tables 5 and 6.

TABLE 5

| Sample No. | Composition (% by wt) Glass amount | | Filler amount | | Firing temp. (° C.) | Porosity (%) | Dielectric constant | tan δ × 10$^{-4}$ | Coefficient of thermal expansion (× 10$^{-6}$/° C.) | Precipitated crystal phase (excepted filler)[1] |
|---|---|---|---|---|---|---|---|---|---|---|
| 1 | A | 39 | γ-Al$_2$O$_3$ | 61 | 1000 | 21  | — did not become dense — | | | |
| 2 | A | 50 | γ-Al$_2$O$_3$ | 50 | 990  | 0.1 | 8.5 | 8  | 7.7 | DI, S, F, α |
| 3 | A | 55 | γ-Al$_2$O$_3$ | 45 | 980  | 0.2 | 8   | 9  | 7.6 | DI, S, F, α |
| 4 | A | 60 | γ-Al$_2$O$_3$ | 40 | 975  | 0.1 | 7.9 | 10 | 7.7 | DI, S, F, α |

TABLE 5-continued

| | | | | | | | | | | |
|---|---|---|---|---|---|---|---|---|---|---|
| 5 | A | 65 | γ-Al₂O₃ | 35 | 975 | 0.1 | 7.7 | 12 | 7.5 | DI, S, F, α |
| 6 | A | 70 | γ-Al₂O₃ | 30 | 950 | 0.2 | 7.6 | 13 | 7.6 | DI, S, F, α |
| 7 | A | 80 | γ-Al₂O₃ | 20 | 950 | 0.1 | 7.5 | 15 | 7.5 | DI, S, F, α |
| 8 | A | 90 | γ-Al₂O₃ | 10 | 925 | 0.2 | 7.5 | 16 | 7.6 | DI, S, F |
| 9 | A | 95 | γ-Al₂O₃ | 5 | 925 | 0.2 | 7.6 | 20 | 7.7 | DI, S, F |
| 10 | A | 100 | — | | 860 | 0.2 | 7.4 | 75 | 9.1 | DI |
| 11 | A | 90 | α-Al₂O₃ | 10 | 850 | 0.3 | 8.4 | 60 | 8.3 | DI |
| 12 | A | 80 | mullite | 20 | 850 | 1.5 | 8.2 | 100 | 7.2 | DI |
| 13 | A | 65 | γ-Al₂O₃<br>α-Al₂O₃ | 5<br>30 | 950 | 0.3 | 7.6 | 15 | 7.5 | DI, S, F |
| 14 | A | 65 | γ-Al₂O₃<br>α-Al₂O₃ | 15<br>20 | 950 | 0.1 | 7.7 | 14 | 7.6 | DI, S, F |
| 15 | A | 70 | γ-Al₂O₃<br>α-Al₂O₃ | 20<br>10 | 950 | 0.2 | 7.7 | 13 | 7.5 | DI, S, F |

| Sample | Glass phase (% by wt) | | Ceramic strength | Thermal conductivity | Young's modulus |
|---|---|---|---|---|---|
| No. | content | SiO₂ | (MPa) | (W/m · K) | (GPa) |
| 1 | — did not become dense — | | | | |
| 2 | 1 | 70 | 320 | 5 | 175 |
| 3 | 1 | 65 | 330 | 4.6 | 170 |
| 4 | 1 | 66 | 330 | 4.4 | 166 |
| 5 | 1 | 65 | 340 | 4 | 165 |
| 6 | 1 | 64 | 330 | 3.6 | 150 |
| 7 | 1 | 65 | 320 | 3.3 | 145 |
| 8 | 2 | 65 | 290 | 3.2 | 142 |
| 9 | 5 | 60 | 280 | 3 | 141 |
| 10 | 19 | 52 | 200 | 1.8 | 90 |
| 11 | 85 | 30 | 220 | 1.5 | 85 |
| 12 | 55 | 43 | 200 | 2.1 | 110 |
| 13 | 5 | 58 | 310 | 3.8 | 165 |
| 14 | 2 | 65 | 320 | 3.9 | 165 |
| 15 | 1 | 66 | 330 | 4 | 167 |

DI: diopside, S: slausonite, F: forsterite, α: α-alumina

TABLE 6

| Sample No. | Composition (% by wt) | | | | Firing temp. (° C.) | Porosity (%) | Dielectric constant | tan δ × 10⁻⁴ | Coefficient of thermal expansion (× 10⁻⁶/° C.) | Precipitated crystal phase (excepted filler)[1] |
|---|---|---|---|---|---|---|---|---|---|---|
| | Glass amount | | Filler amount | | | | | | | |
| 16 | A | 65 | γ-Al₂O₃<br>SiO₃ | 5<br>30 | 950 | 0.2 | 5.9 | 8 | 10.7 | DI, F |
| 17 | A | 60 | γ-Al₂O₃<br>SiO₃ | 20<br>10 | 950 | 0.1 | 6.7 | 9 | 9.5 | DI, F |
| 18 | A | 65 | γ-Al₂O₃<br>MgTiO₃ | 20<br>15 | 950 | 0.2 | 9.4 | 11 | 8.7 | DI, F |
| 19 | A | 65 | γ-Al₂O₃<br>(Mg,Zn)TiO₃ | 20<br>15 | 950 | 0.2 | 9.5 | 12 | 8.8 | DI, F |
| 20 | B | 39 | γ-Al₂O₃ | 61 | 1000 | 20 | — did not become dense — | | | DI, S, F, α |
| 21 | B | 60 | γ-Al₂O₃ | 40 | 975 | 0.1 | 8.4 | 11 | 8.1 | DI, S, F, α |
| 22 | B | 75 | γ-Al₂O₃ | 25 | 950 | 0.2 | 8.1 | 12 | 8 | DI, S, F, α |
| 23 | B | 85 | γ-Al₂O₃ | 15 | 900 | 0.1 | 8.0 | 14 | 7.9 | DI, S, F, |
| 24 | B | 100 | — | | 850 | 0.3 | 8.9 | 90 | 9.3 | DI |
| 25 | B | 65 | γ-Al₂O₃<br>α-Al₂O₃ | 15<br>20 | 900 | 0.1 | 8.3 | 16 | 9.1 | DI, S, F |
| 26 | B | 60 | γ-Al₂O₃<br>SiO₃ | 15<br>20 | 925 | 0.2 | 7.1 | 9 | 10 | DI, S, F |
| 27 | B | 65 | γ-Al₂O₃<br>MgTiO₃ | 15<br>20 | 950 | 0.1 | 11 | 10 | 11 | DI, S, F |
| 28 | B | 65 | γ-Al₂O₃<br>(Mg,Zn)TiO₃ | 15<br>20 | 950 | 0.2 | 12 | 9 | 10.5 | DI, S, F |
| 29 | C | 65 | γ-Al₂O₃ | 35 | 900 | — | — melt — | | | — |
| 30 | C | 50 | γ-Al₂O₃ | 50 | 930 | 2.8 | 7.9 | 120 | 8.0 | |

| Sample | Glass phase (% by wt) | | Ceramic strength | Thermal conductivity | Young's modulus |
|---|---|---|---|---|---|
| No. | content | SiO₂ | (MPa) | (W/m · K) | (GPa) |
| 16 | 0 | — | 250 | 2 | 100 |
| 17 | 1 | 60 | 270 | 3.1 | 140 |

TABLE 6-continued

| 18 | 2 | 62 | 275 | 3.2 | 140 |
| 19 | 2 | 63 | 280 | 3.3 | 140 |
| 20 | | | — did not become dense — | | |
| 21 | 1 | 72 | 330 | 4.9 | 170 |
| 22 | 1 | 70 | 325 | 4.7 | 165 |
| 23 | 1 | 68 | 330 | 4.5 | 155 |
| 24 | 35 | 44 | 200 | 1.6 | 100 |
| 25 | 2 | 70 | 310 | 4.6 | 160 |
| 26 | 2 | 65 | 300 | 3.1 | 140 |
| 27 | 1 | 64 | 290 | 3.3 | 145 |
| 28 | 2 | 60 | 290 | 3.5 | 150 |
| 29 | | | — melt — | | |
| 30 | 50 | 10 | 190 | 1.1 | 100 |

DI: diopside, S: slausonite, F: forsterite, α: α-alumina

As will be obvious from the results of tables 5 and 6, the samples Nos. 1 and 20 containing glasses A and B in amounts of smaller than 40% by weight could not be sintered at low temperatures, and from which the ceramics that were so dense as to exhibit relative densities of not smaller 97% could not be obtained.

The samples Nos. 10 and 24 containing not more than 1% by weight of γ-$Al_2O_3$ contained the amorphous glass phase in large amounts in the ceramics, and exhibited increased tan δ and decreased strengths. The samples Nos. 11 and 12 using α-$Al_2O_3$ only or mullite only as a filler powder, contained the amorphous glass phase in large amounts and exhibited high tan δ.

When γ-$Al_2O_3$ was used as a filler powder, on the other hand, the ceramics exhibited tan δ at 60 GHz of not higher than $30\times10^{-4}$, a coefficient of thermal expansion of not smaller than 5 ppm/° C., a dielectric constant of not smaller than 8 and a strength of not smaller than 250 MPa.

What is claimed is:

1. A ceramic comprising filler crystal particles and a matrix crystal phase formed by a set of a number of crystal particles present on the grain boundaries of the filler crystal particle, wherein
    said filler crystal particles have an average particle diameter of not smaller than 2.5 μm and comprise at least one kind of oxide crystals selected from the group consisting of $Al_2O_3$, $MgTiO_3$, (Mg, Zn)$TiO_3$, $TiO_2$, $SrTiO_3$, $MgAl_2O_4$, $ZnAl_2O_4$, cordierite, mullite, enstatite, willemite, $CaAl_2Si_2O_8$, $SrAl_2Si_2O_8$, (Sr, Ca)$Al_2Si_2O_8$ and forsterite and
    the ceramic exhibiting dielectric loss tangent at 60 to 77 GHz of not higher than $50\times10^{-4}$.

2. The ceramic according to claim 1, wherein said matrix crystal phase is formed by a set of crystal particles precipitated from a crystallized glass having a Pb content in an amount of 0 or not larger than 10% by weight in terms of PbO.

3. The ceramic according to claim 1, wherein said matrix crystal phase is formed by at least one kind of those selected from the group consisting of diopside-type oxide crystal, $MgAl_2O_4$, $ZnAl_2O_4$, cordierite, mullite, enstatite, willemite, $CaAl_2Si_2O_8$, $SrAl_2Si_2O_8$, (Sr, Ca)$Al_2Si_2O_8$ and forsterite.

4. The ceramic according to claim 3, wherein said matrix crystal phase is formed of the diopside-type oxide crystals, and contains not more than 30% by weight of said amorphous glass phase which contains Si in an amount of not less than 70% by weight in terms of $SiO_2$.

5. The ceramic according to claim 4, wherein said filler crystal particles are at least those of one kind selected from the group consisting of $Al_2O_3$, $MgAl_2O_4$ and $ZnAl_2O_4$.

6. The ceramic according to claim 5, wherein said filler crystal particles are those of the γ-alumina.

7. The ceramic according to claim 1, further containing not more than 10% by weight of an amorphous glass phase containing Si in an amount of not smaller than 40% by weight in terms of $SiO_2$.

8. The ceramic according to claim 1, having a coefficient of thermal expansion at room temperature to 400° C. of not smaller than 5 ppm/° C. and a strength of not smaller than 200 MPa.

9. The ceramic according to claim 1, wherein the thermal conductivity is not smaller than 2 W/m·K.

10. A wiring board comprising an insulating substrate and a metallized wiring layer arranged on the surface and/or inside said insulating substrate, wherein said insulating substrate is formed of the ceramic of claim 1.

11. A wiring board according to claim 10, wherein said metallized wiring layer is formed of a conductor containing Cu or Ag as a chief, component.

* * * * *